(12) United States Patent
Okubo

(10) Patent No.: US 10,418,532 B2
(45) Date of Patent: Sep. 17, 2019

(54) SEMICONDUCTOR LIGHT-EMITTING DEVICE AND METHOD FOR PRODUCING THE SAME

(71) Applicant: Stanley Electric Co., Ltd., Tokyo (JP)

(72) Inventor: Tsutomu Okubo, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/116,347

(22) Filed: Aug. 29, 2018

(65) Prior Publication Data
US 2019/0074415 A1     Mar. 7, 2019

(30) Foreign Application Priority Data

Sep. 4, 2017  (JP) ................................. 2017-169204

(51) Int. Cl.
| | |
|---|---|
| *H01L 33/56* | (2010.01) |
| *H01L 33/00* | (2010.01) |
| *H01L 33/36* | (2010.01) |
| *H01L 33/50* | (2010.01) |

(52) U.S. Cl.
CPC ............ *H01L 33/56* (2013.01); *H01L 33/005* (2013.01); *H01L 33/36* (2013.01); *H01L 33/501* (2013.01)

(58) Field of Classification Search
CPC ....... H01L 33/56; H01L 33/005; H01L 33/36; H01L 33/501
See application file for complete search history.

(56) References Cited

U.S. PATENT DOCUMENTS

| | | | | |
|---|---|---|---|---|
| 6,066,861 A | * | 5/2000 | Hohn ................. | C09K 11/7718 252/301.36 |
| 7,527,991 B2 | * | 5/2009 | Sato ...................... | C09K 11/06 257/E21.502 |
| 2003/0080341 A1 | * | 5/2003 | Sakano .................. | B29C 67/08 257/79 |

FOREIGN PATENT DOCUMENTS

JP    2004-128424 A    4/2004

OTHER PUBLICATIONS

Song et al. ("The effects of particle size distribution on the optical properties of titanium dioxide rutile pigments and their applications in cool non-white coatings," Solar Energy Materials & Solar Cells, 130, pp. 42-50, 2014) (Year: 2014).*

* cited by examiner

*Primary Examiner* — Yasser A Abdelaziez
(74) *Attorney, Agent, or Firm* — Kenealy Vaidya LLP

(57) ABSTRACT

Provided are a semiconductor light-emitting device capable of easily adjusting the light intensity of output light and a method for producing such a semiconductor light-emitting device. The semiconductor light-emitting device includes: a substrate; a light-emitting element mounted on the substrate; and a seal layer provided on the substrate so as to cover the light-emitting element. The seal layer contains resin and inorganic pigment particles. The inorganic particles have an average particle size of 1 □m or larger and 50 □m or smaller in a volumetric basis particle size distribution by a laser diffraction scattering particle size distribution measurement method. The inorganic particles distributed at a concentration becoming thicker in a direction toward said substrate.

9 Claims, 4 Drawing Sheets

SEMICONDUCTOR LIGHT-EMITTING DEVICE AND METHOD FOR PRODUCING THE SAME

BACKGROUND OF THE INVENTION

1. Field of the Invention

The present invention, in particular, relates to a semiconductor light-emitting device including a semiconductor element such as a light-emitting diode (LED) and a method for producing such a semiconductor light-emitting device.

2. Description of the Related Art

Light intensities of light-emitting elements have been improved in its output intensities in recent years. However, light-emitting elements having low light intensities, are also required for use in indicators, for example. In view of this, light-emitting devices having low light intensities have been provided by adjusting light intensities of high light intensity light-emitting elements.

Patent Literature 1, for example, discloses a white light-emitting device in which variations in luminance are adjusted by mixing a black pigment, as a light attenuation material, into a covering or seal member containing phosphor particles mixed therein (Japanese Patent Application Laid-Open No. 2004-128424).

SUMMARY OF THE INVENTION

When light intensity is controlled by adjusting an amount of the black pigment mixed into the covering member together with the phosphor particles as in the light-emitting device described in Patent Literature 1, the control of the light intensity is difficult to achieve because a change in a mix rate of the pigment leads to a large change in light intensity.

The present invention has been made in view of the aforementioned problem, and an object of the present invention is to provide a semiconductor light-emitting device capable of easily adjusted the light intensity of output light and a method for producing a semiconductor light-emitting device having such a property as mentioned above.

In order to achieve the aforementioned object, one aspect of the present invention provides a semiconductor light-emitting device including: a substrate; a light-emitting element mounted on the substrate; and a seal layer provided on the substrate so as to seal the light-emitting element. The seal layer contains resin layer containing inorganic pigment particles dispersed therein. An average particle size of said inorganic pigment particles has from 1 μm to 50 μm or smaller in a volumetric basis particle size distribution which is measured by a laser diffraction scattering particle size distribution measurement method. The inorganic pigment particles dispersed at a concentration becoming thicker in a direction toward the substrate.

Another aspect of the present invention provides a method for producing a semiconductor light-emitting device including the steps of: placing a light-emitting element on a substrate; performing potting so as to cover the light-emitting element with a resin raw material containing at least inorganic pigment particles as a component; settling out the inorganic pigment particles toward the substrate; and curing the resin raw material.

DETAILED DESCRIPTION OF THE INVENTION

First Embodiment

Figure 1:
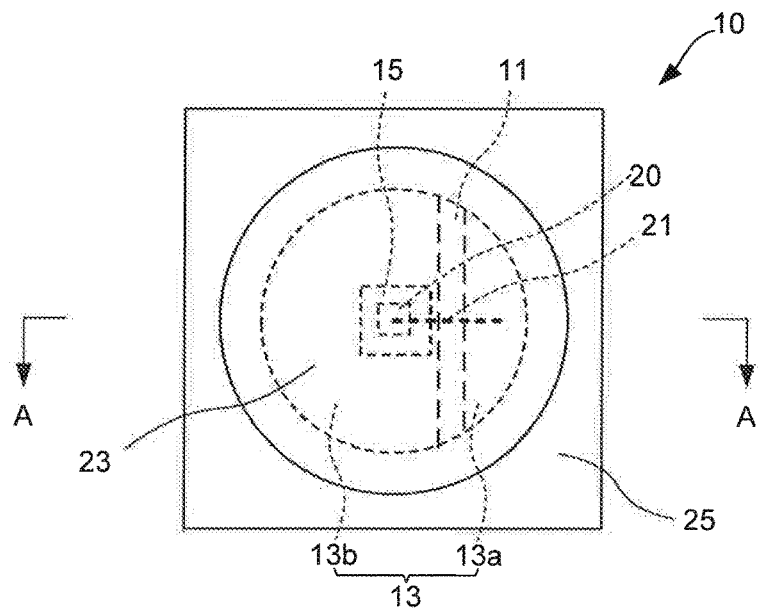
FIG. 1 is a top view of a semiconductor light-emitting device according to a first embodiment.

A preferred embodiment of the present invention will now be described below in detail. Note that substantially the same or equivalent parts are denoted by the same reference numerals in the following description and the accompanying drawings.

Figure 2:
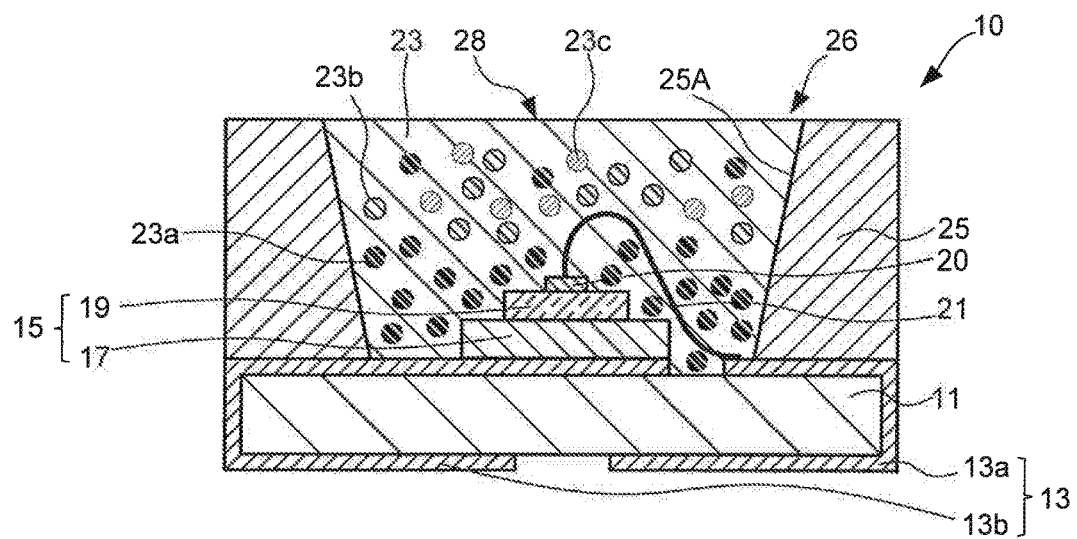
FIG. 2 is a cross-sectional view taken along line A-A in FIG. 1.

FIG. 1 shows an upper surface of a semiconductor light-emitting device 10 according to the first embodiment. As shown in FIGS. 1 and 2, an example of a package substrate 11 (mounting board), which serves as a substrate, is a glass epoxy substrate. A glass silicone substrate or a substrate made of a ceramic material such as alumina or AlN may also be employed as the package substrate 11. A connection electrode 13, which is formed, for example, by plating a conductor such as Cu on a surface of the package substrate 11, is provided on the surface of the package substrate 11.

The connection electrode 13 includes a p-connection electrode layer 13a and an n-connection electrode layer 13b. The connection electrode layers 13a and 13b are each formed so as to extend from one (upper surface) of principal surfaces of the package substrate 11 to the other one (lower surface) of the principal surfaces through a side surface of the package substrate 11. The p-connection electrode layer 13a and the n-connection electrode layer 13b are insulated from each other by being provided spaced apart from each other on the surface of the package substrate 11.

A light-emitting element 15 is mounted on the n-connection electrode layer 13b provided on the one (upper surface) of the principal surfaces of the package substrate 11. The light-emitting element 15 has a planar shape smaller than that of the package substrate 11. The package substrate 11, and upper surfaces of the p-connection electrode layer 13a and the n-connection electrode layer 13b are therefore exposed around the light-emitting element 15 on the upper surface of the package substrate 11. Note that a surface in the same direction as the upper surface of the package substrate 11 will be referred to as an "upper surface" in the following description. Moreover, a surface opposite to the upper surface will be referred to as a "lower surface." Furthermore, a direction moving away from the upper surface of the package substrate 11 in a vertical direction will be referred to as an "upper side" and a direction opposite thereto will be referred to as a "lower side" in the following description.

The light-emitting element 15 includes an element substrate 17 and a semiconductor structure layer 19 mounted on an upper surface of the element substrate 17. The element substrate 17 is a light-transmitting substrate having a conductive property and a light-transmitting property to light outputted from the semiconductor structure layer 19. SiC, for example, may be employed as the element substrate 17.

The element substrate 17 is fixed onto the n-connection electrode layer 13b with a conductive die attach (not shown) such as an Ag paste, for example. That is, the element substrate 17 and the n-connection electrode layer 13b are electrically connected to each other.

The semiconductor structure layer 19 is formed, for example, by depositing an InGaN-based semiconductor layer including a light-emitting layer on the element substrate 17 or joining the InGaN-based semiconductor layer and the element substrate 17 together. The semiconductor structure layer 19 is deposited by a crystal growth (such as epitaxial growth) of a semiconductor material. Blue light having a wavelength of about 450 nm, for example, is outputted from the light-emitting layer of the semiconductor structure layer 19.

An upper surface electrode 20 is provided on an upper surface of the semiconductor structure layer 19. The upper surface electrode 20 is made of a conductive material such as Au. The upper surface electrode 20 and the p-connection electrode layer 13a are connected to each other by means of wire bonding with a conductive wire 21 such as Au.

A resin body or seal layer 23 is formed on an upper surface of the light-emitting element 15 so as to bury the light-emitting element 15 therein. In other words, the resin body 23 is formed so as to cover or seal the upper surface and side surfaces (light-emitting surfaces) of the light-emitting element 15. The resin body 23 includes a resin such as a silicone, epoxy, or acrylic resin, for example, as a main component.

The resin body 23 contains an inorganic pigment particles 23a, a phosphor particles 23b and a light scatterers 23c. In other words the resin body 23 contains a resin layer containing the inorganic pigment particles 23a, the phosphor particles 23b and the light scatterers 23c dispersed therein.

It can be said the inorganic pigment particles 23a are mainly localized or concentrated within a region of the resin body 23 closer to the package substrate 11. For example, the inorganic pigment particles 23a are distributed in such a manner that a region of the resin body 23 located up to a height approximately the same as the height of the light-emitting element 15 has the highest concentration and the concentration of the inorganic pigment particles 23a gradually decreases toward the upper side (the direction moving away from the upper surface of the package substrate 11 in the vertical direction). In other words the inorganic particles 23a are dispersed at concentrations each becoming thicker in a direction toward the package substrate 11.

The inorganic pigment is a black inorganic pigment having titanium as a main component. Examples of such a black inorganic pigment having titanium as a main component may include an inorganic pigment obtained by reducing a titanium oxide.

Each of the inorganic pigment particles 23a may preferably has a specific gravity higher than that of the resin that constitutes the resin body 23. Examples of the inorganic pigment particle 23a that has an element other than titanium as a main component and has a specific gravity higher than that of the resin may include an iron oxide-based pigment. An example of such an iron oxide-based pigment is iron tetroxide. Moreover, the inorganic pigment particle 23a may be an insulator or may have a particle surface insulated by a surface treatment. Furthermore, the inorganic pigment particle 23a may contain no metallic atom and may be carbon black, for example.

In order to distribute the inorganic pigment particles 23a unevenly in the resin body 23, it is better for the inorganic pigment particle 23a to have a shape less likely to receive the influence of buoyancy generated in the resin raw material of the resin body 23. For example, the inorganic pigment particle 23a is more preferred to have a shape less likely to receive the influence of the buoyancy of the resin body 23, such as a spherical shape, than to have a shape more likely to receive the influence of the buoyancy, such as a flat plate shape.

Furthermore, the inorganic pigment particle 23a may not be configured by a single component. Alternatively, the inorganic pigment particles 23a may be a coated product obtained by coating glass or a resin, for example, used as a core material with the inorganic pigment particles 23a. Note that the inorganic pigment particles 23a may have a color other than black. In this case, the lightness (L-value) of the inorganic pigment particles 23a is preferably 50 or smaller, more preferably 30 or smaller.

The inorganic pigment particles 23a have an average particle size of 1 μm or larger and 50 μm or smaller in volumetric basis particle size distribution by a laser diffraction scattering particle size distribution measurement method. In other words an average particle size of the inorganic pigment particles 23a have from 1 μm to 50 μm or smaller in a volumetric basis particle size distribution which is measured by a laser diffraction scattering particle size distribution measurement method.

By setting the average particle size of the inorganic pigment particles 23a to 50 μm or smaller, light outputted from the light-emitting element 15 can be prevented from excessively passing through gaps formed between the inorganic pigment particles 23a. If the inorganic pigment particles 23a have an average particle size of smaller than 1 μm, on the other hand, the inorganic pigment particles 23a are dispersed throughout the resin body 23 and become less likely to settle out.

The resin body 23 can be formed, for example, by dropping (potting) a mixture liquid of a liquid resin and the inorganic pigment particles 23a onto the upper surface of the light-emitting element 15. Thus, the average particle size of the inorganic pigment particles 23a may be adjusted in accordance with a nozzle diameter used when the potting of the resin raw material, which is a raw material of the resin body 23, is performed. As an example, the average particle size is preferably set to 10 μm or larger and 30 μm or smaller, more preferably 10 μm or larger and 20 μm or smaller.

The phosphor particles 23b may be settled out in a lower part (on the side closer to the upper surface of the package substrate 11) of the resin body 23 or dispersed throughout the resin body 23. In order to obtain light scattering effect, the light scatterers 23c are preferably selected to have a particle size small enough to keep a dispersed state in the resin body 23, e.g., an average particle size of smaller than 10 μm.

For example, a phosphor particle 23b to be excited by blue light to output yellow fluorescence. Examples such as the phosphor particle 23b may include Ce-doped yttrium-aluminum-garnet (YAG:Ce), Ce-doped terbium-aluminum-garnet (TAG:Ce), an orthosilicate phosphor (such as (BaSrCa)SiO$_4$), or an α-sialon phosphor (such as Ca-α-SiAlON:Eu).

The light outputted from the light-emitting element 15 in the present embodiment is blue light. The resin body 23 contains silicate phosphor particles 23b that produce yellow emission. These silicate phosphor particles 23b are excited by the blue light, thereby producing yellow emission, which is a complementary color of blue. Thus, light outputted from a light output surface 28 is turned to white light by the additive color mixing of the blue light and the yellow light.

The light scatterers 23c are light-scattering particles made of $TiO_2$, $SiO_2$, ZnO, or $Al_2O_3$, for example. Note that only one of the phosphor particle 23b and the light scatterer 23c may be included in the resin body 23. Alternatively, both of the phosphor particles 23b and the light scatterers 23c may not be included in the resin body 23.

In an alternative example, another resin layer containing the light scatterers 23c may be formed so as to cover the resin body 23 containing the inorganic pigment particles 23a and the phosphor particles 23b. In a still alternative example, another resin layer containing the phosphor particles 23b may be formed so as to cover the resin body 23 containing the inorganic pigment particles 23a and the light scatterers 23c.

A reflector 25 is a columnar frame provided on the upper surface of the package substrate 11 by means of fixing with an adhesive made of an epoxy resin, for example. The reflector 25 is made of a material called a white resin in which the light scatterers 23c are dispersed in a resin material such as a silicone resin. The reflector 25 has a through hole 25A, and the through hole 25A has an inverted truncated cone shape expanding toward the direction moving away from the upper surface of the package substrate 11.

The light-emitting element 15 is surrounded by an inner wall surface (inner surface) of the through hole 25A on the package substrate 11. In other words, the reflector 25 is a tubular frame that surrounds the light-emitting element 15. One of opening planes of the tubular frame abuts against a semiconductor surface. The other opening plane is configured to guide light outputted from the light-emitting element 15. A cavity 26 in the shape of an inverted truncated cone (mortar) is formed by the upper surface of the package substrate 11 and the inner wall surface of the through hole 25A of the reflector 25. That is, the reflector 25 forms the cavity 26 together with the package substrate 11, and the light-emitting element 15 is accommodated on a bottom surface of the mortar-shaped cavity 26.

Such a structure causes light outputted from the light-emitting element 15 to be reflected by the inner wall surface of the reflector 25 and travel toward the upper side. In other words, the inner wall surface of the reflector 25 is a reflection surface for reflecting the light outputted from the light-emitting element 15.

Examples of a resin for forming the reflector 25 may include epoxy resins and polyamide-based resins. Examples of the light scatterer 23c may include white pigment particles such as $TiO_2$, BN, $Al_2O_3$, ZnO, $BaSO_4$, and $SiO_2$.

The light-emitting element 15 and the conductive wire 21 are buried in the cavity 26 by the resin body 23. An upper surface of the resin body 23 serves as the light output surface 28 of the semiconductor light-emitting device 10.

The present embodiment describes the case where the reflector 25, the connection electrode 13 and the package substrate 11 are formed as separate elements. These elements, however, can be provided as a PLCC (plastic leaded chip carrier) package in which these elements are formed integrally (as an integral type) by the insert molding of the connection electrode 13 made of a metal into the reflector 25 and the package substrate 11 made of a resin. In the case of the PLCC package, a polyamide-based resin, for example, can be used as a material, of the package substrate 11 and the reflector 25.

Light outputted from the upper surface and side surfaces of the semiconductor structure layer 19 enters into the resin body 23. A certain proportion of the light that has entered into the resin body 23 is absorbed by the inorganic pigment particles 23a. This causes the attenuation of the light outputted from the upper surface and side surfaces of the semiconductor structure layer 19, thus achieving the adjustment of the light intensity.

Light outputted from the light output surface 28 of the semiconductor light-emitting device 10 includes the light that has attenuated by passing through the resin body 23 and light outputted from side surfaces of the element substrate 17 without the intervention of the resin body 23. The light intensity (intensity) of the light outputted from the light output surface 28 can be controlled by changing the concentration of the inorganic pigment particles 23a in the resin body 23 so as to change the attenuation factor of the light passing through the resin body 23.

The light outputted from the light-emitting element 15 is scattered by the light scatterers 23c or the phosphor particles 23b included in the resin body 23 and then outputted from the light output surface 28. Consequently, output light with uniform luminance can be obtained at the light output surface 28.

Figure 3:
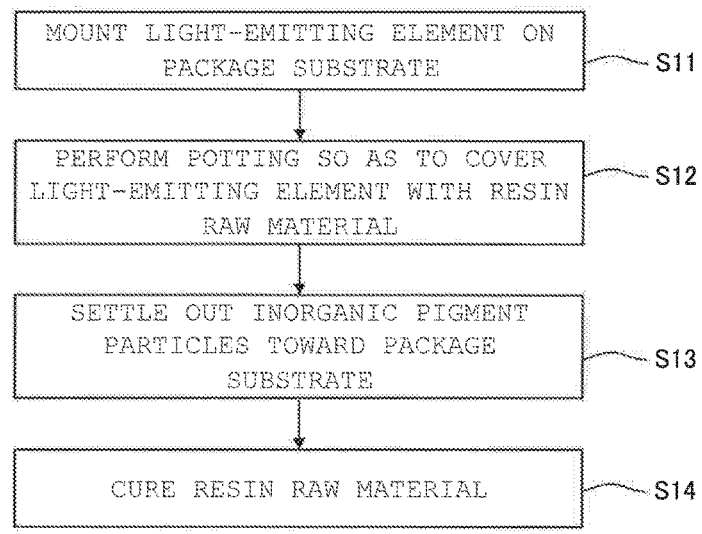
FIG. 3 is a flow chart showing production steps of the semiconductor light-emitting device according to the first embodiment.

A method for producing the above-described semiconductor light-emitting device will now be described with reference to FIG. 3.

The light-emitting element 15 is mounted on the package substrate 11 by fixing the element substrate 17 to the package substrate 11 and then connecting the upper surface electrode 20 to the p-connection electrode layer 13a by means of wire bonding (step S11).

A resin raw material is prepared by mixing the inorganic pigment particles 23a, the phosphor particles 23b, and the light scatterers 23c into a liquid resin, and potting is performed so as to cover the light-emitting element 15 with the prepared resin raw material. That is, the light-emitting element 15 is embedded with the resin raw material (step S12).

The inorganic pigment particles 23a included in the resin raw material are settled out toward the package substrate 11 (step S13). Specifically, the inorganic pigment particles 23a are settled out toward the package substrate 11 by means of gravity settling (step S13).

In this step, the resin raw material may be heated to lower the viscosity of the resin raw material and thereby facilitate the gravity settling of the inorganic pigment particles 23a.

Centrifugal force may be used as another method for settling out the inorganic pigment particles 23a toward the package substrate 11. For example, the package substrate 11 may be set in a device for generating centrifugal force, such as a centrifuge, and centrifugal force may be generated after the potting so as to settle out the inorganic pigment particles.

When a material having a magnetic property is used for the inorganic pigment particles, the inorganic pigment particles 23a may be attracted toward the package substrate 11 by the magnetic force.

The resin raw material is heated to its curing temperature to perform a curing reaction so that the resin raw material is cured (step S14).

Comparative Evaluation

A comparative evaluation on ease of light intensity adjustment of the semiconductor light-emitting device 10 of the first embodiment was performed using a light-emitting device of Comparative Example 1.

Common configurations of the first embodiment and Comparative Example 1 are shown in Table 1.

TABLE 1

| PACKAGE | TYPE | PLCC |
|---|---|---|
| | OUTER DIMENSIONS | 2.2 × 1.7 × t0.8 mm |
| | CAVITY | 1.8 × 1.1 × t0.5 mm |
| ELEMENT | | InGaN (λd = 450~460 nm) |
| | OUTER DIMENSIONS | 0.34 × 0.2 × t0.12 mm |
| RESIN | | DIMETHYL-BASED SILICONE |
| PHOSPHOR | MATERIAL | ORTHOSILICATE |
| | EMISSION COLOR | YELLOW |
| | PARTICLE SIZE | D50[μm] 12 |
| | CONCENTRATION | 12~25 wt % |

Package

A PLCC package was used. The package having outer dimensions of 2.2 mm×1.7 mm×t0.8 mm was used. The cavity had a shape with outer dimensions of 1.8 mm×1.1 mm×t0.5 mm.

Light-Emitting Element

An InGaN light-emitting element that produces output light with a dominant wavelength of 450 nm to 460 nm was used. The outer dimensions of the light-emitting element 15 were 0.34 mm×0.20 mm×t0.12 mm.

Resin Body

A dimethyl-based silicone was employed as a resin used for the resin body 23. Orthosilicate was employed as the phosphor particles 23b. The emission color of the phosphor particles 23b was yellow. The average particle size of the phosphor particles 23b was 12 μm. The concentration of the phosphor particles 23b in the resin body 23 was 12 to 25 wt %. Note that the resin body 23 included no light scatterers 23c.

Composition of Inorganic Pigment Particle in Comparative Example 1

Inorganic pigment particles 23a of Comparative Example 1 will be shown in Table 2.

TABLE 2

| | MATERIAL | | BLACK TITANIUM OXIDE |
|---|---|---|---|
| PIGMENT | COLOR TONE | L VALUE | 25.08 |
| | | a VALUE | −4.62 |
| | | b VALUE | 1.1 |
| | PARTICLE SIZE | D50 [μm] | 21.8 |
| | SHAPE | | PLATE SHAPE |

A black titanium oxide was employed as the inorganic pigment particle 23a. The color tone of the black titanium oxide had an L value of 25.08, an a value of −4.62, and a b value of 1.10. The particle size of the black titanium oxide was 21.8 μm. The black titanium oxide had a plate shape.

Composition of Inorganic Pigment Particle in First Embodiment

The inorganic pigment particles 23a of the first embodiment will be shown in Table 3.

TABLE 3

| | MATERIAL | | BLACK TITANIUM OXIDE |
|---|---|---|---|
| PIGMENT | COLOR TONE | L VALUE | 15.49 |
| | | a VALUE | 7.59 |
| | | b VALUE | −16.44 |

TABLE 3-continued

| | MATERIAL | | BLACK TITANIUM OXIDE |
|---|---|---|---|
| | PARTICLE SIZE | D50 [μm] | 22.1 |
| | SHAPE | | GRANULAR SHAPE |

A black titanium oxide was employed as the inorganic pigment particle 23a. The color tone of the black titanium oxide had an L value of 15.49, an a value of 7.59, and a b value of −16.44. The particle size of the black titanium oxide was 22.1 μm. The black titanium oxide had a granular shape.

Comparative Evaluation Test

In the comparative evaluation, an equivalent amount of forward current was supplied to the light-emitting devices of the first embodiment and Comparative Example 1, and the intensity of light outputted from the light output surface 28 was evaluated in each of the devices. Specifically, a comparative evaluation was made on correlations between the concentrations of the inorganic pigment particles 23a included 1.5 in the resin body 23 of the first embodiment and the resin body 23 of Comparative Example 1 and relative light intensities. Note that the concentrations of the inorganic pigment particles 23a in this experiment are expressed as weight percent concentrations in the resin raw materials. The relative light intensities are relative values with respect to 100% indicating a light intensity in a case where no inorganic pigment particles 23a are added.

Figure 4:
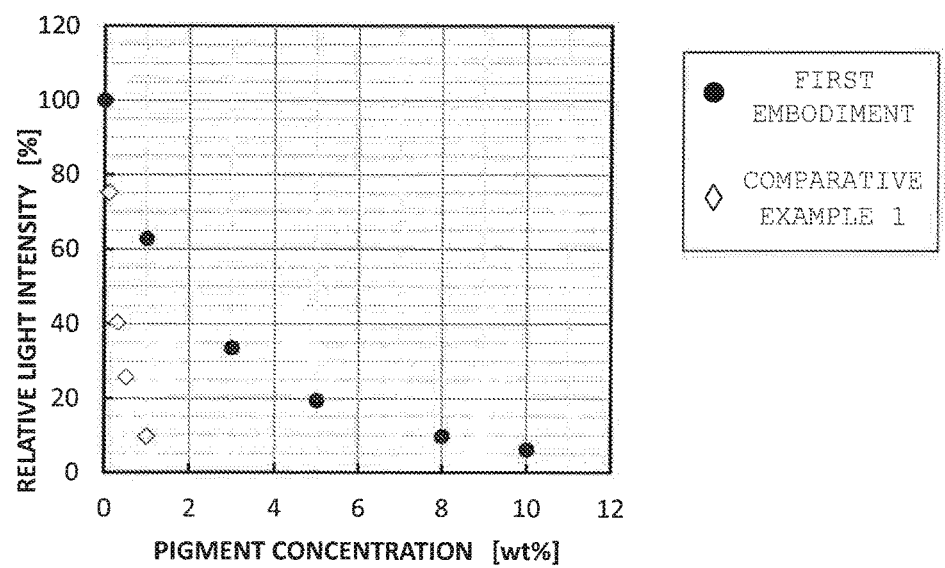
FIG. 4 is a graph showing a result of a comparative test between the first embodiment and Comparative Example 1.

A graph of FIG. 4 shows a result of the comparative evaluation on the relative light intensities with respect to the concentrations of the inorganic pigment particles 23a in the semiconductor light-emitting devices of the first embodiment and Comparative Example 1. In the graph of FIG. 4, the horizontal axis indicates a concentration of the inorganic pigment particles, whereas the vertical axis indicates relative light intensity.

As shown in FIG. 4, when the concentration of the inorganic pigment particles 23a increased from 0 wt % to 1 wt % in the semiconductor light-emitting device of Comparative Example 1, the relative light intensity decreased from 100% to 9.7%.

In contrast, in the semiconductor light-emitting device 10 of the first embodiment, when the concentration of the inorganic pigment particles 23a increased from 0 wt % to 10 wt %, the relative light intensity decreased from 100% to 6.1%. Therefore, as compared to Comparative Example 1, the relative light intensity gradually decreases as the content of the inorganic pigment particles 23a increases. As just described, it can be concluded that the semiconductor light-emitting device 10 of the first embodiment can control its light intensity by the concentration of the inorganic pigment particles 23a more easily as compared to the semiconductor light-emitting device of Comparative Example 1.

Figure 5:
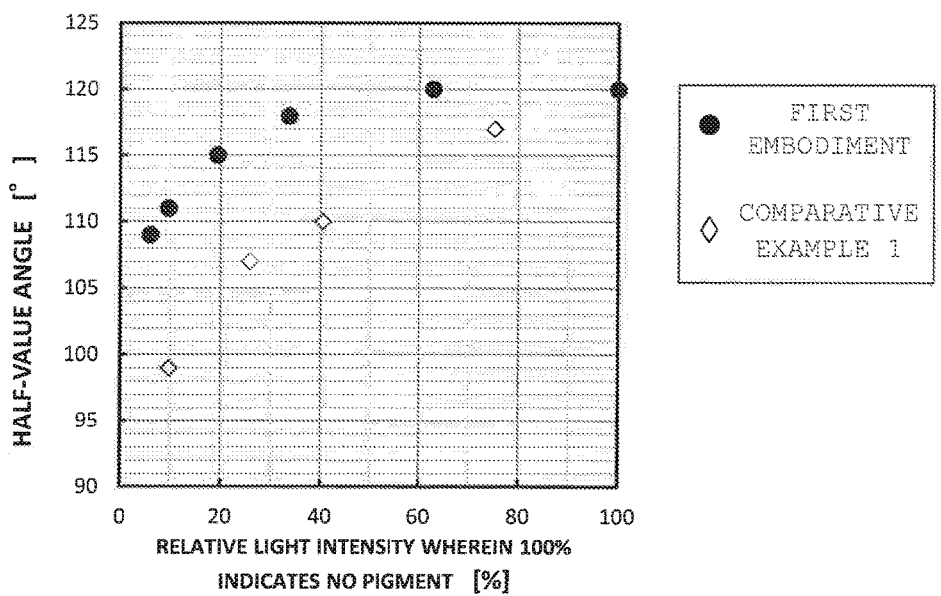
FIG. 5 is a graph showing a result of a comparative test between the first embodiment and Comparative Example 1.

A graph of FIG. 5 shows a result of a comparative evaluation on half-value angles with respect to relative light intensities in the semiconductor light-emitting devices of the first embodiment and Comparative Example 1.

As shown in FIG. 5, the half-value angle in Comparative Example 1 decreased in an approximately proportional manner along with a decrease in the relative light intensity. Specifically, the half-value angle was 120 degrees at relative light intensity of 100%. The half-value angle was 99 degrees at relative light intensity of 10%.

In the first embodiment, the half-value angle also decreases in an approximately proportional manner along with a decrease in the relative light intensity as with Comparative Example 1. The slope of the first embodiment, however, is gentler than that of Comparative Example 1. Specifically, the half-value angle was 120 degrees at relative light intensity of 100%. The half-value angle was 110 degrees at relative light intensity of 10%.

As just described, it can be concluded that the semiconductor light-emitting device 10 of the first embodiment has less influence of the concentration of the inorganic pigment particles 23a on the half-value angle as compared to the semiconductor light-emitting device of Comparative Example 1.

The average particle size of the inorganic pigment particles contained in the resin body 23 of the semiconductor light-emitting device 10 of the present invention is 1 μm to 50 μm. The average particle size of the inorganic pigment particles contained in the conventional resin body 23 is about 100 nm at most. Therefore, the inorganic pigment particles contained in the resin body 23 of the semiconductor light-emitting device 10 of the present invention have an average particle size larger than the average particle size of the conventional inorganic pigment particles. That is, a difference occurs in the surface area of the inorganic pigment particles contained in the present invention that absorb light. Thus, even when the same concentrations of the inorganic pigment particles are contained in the resin bodies 23, the semiconductor light-emitting device 10 can adjust light intensity more easily as compared to the conventional semiconductor light-emitting device.

The inorganic pigment particles of the present invention are intensively present in a region of the resin body 23 closer to the package substrate 11. That is, the relative number of the inorganic pigment particles that absorb light outputted in an oblique direction having an angle to the principal surfaces of the package substrate 11 (light other than those in the horizontal direction and the vertical direction with respect to the principal surfaces) decreases. Therefore, it becomes possible to maintain an amount of light outputted in directions other than the vertical direction with respect to the principal surfaces, thus yielding a higher half-value angle as compared to Comparative Example 1. Consequently, the semiconductor light-emitting device 10 of the present invention can produce output light with stable quality over a wide angle.

Thus, the light intensity of output light from the light output surface 28 can be stabilized easily among individual semiconductor light-emitting devices 10. That is, the semiconductor light-emitting devices providing the same light intensity can be produced easily with high yield.

Moreover, in the method for producing a semiconductor light-emitting device according to the present invention, the inorganic pigment particles can be arranged intensively in a region of the resin body 23 closer to the package substrate 11 in the step of forming the resin body 23. Thus, such a process can be performed in one step without the need for new production equipment or an additional production step.

Second Embodiment

Figure 6:
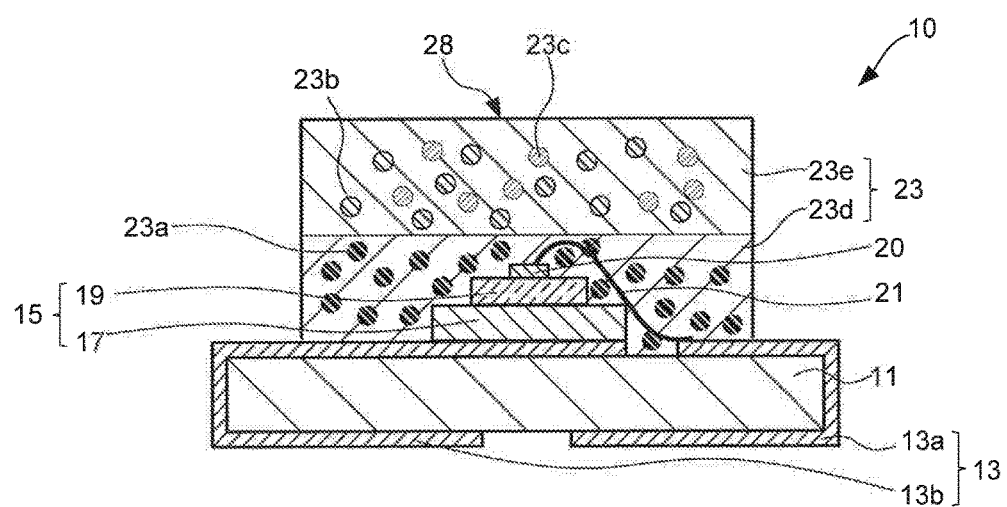
FIG. 6 is a cross-sectional view of a semiconductor light-emitting device according to a second embodiment.

FIG. 6 is a cross-sectional view of a semiconductor light-emitting device according to the second embodiment. The same elements as those in the semiconductor light-emitting device of the first embodiment will be denoted by the same reference numerals and the description thereof will be omitted.

A resin layer 23 includes a first resin layer 23d provided in contact with a light-emitting element 15, and a second resin layer 23e provided so as to cover the first resin layer 23d.

The first resin layer 23d is provided so as to cover or seal the light-emitting element 15. Specifically, the first resin layer 23d is provided so as to cover an upper surface and side surfaces of the light-emitting element 15. A conductive wire 21 is also sealed by the first resin layer 23d. The first resin layer 23d is a layer containing a resin as a main component, such as a silicone resin, and inorganic pigment particles 23a.

The second resin layer 23e is formed so as to cover an upper surface of the first resin layer 23d. The second resin layer 23e contains a resin as a main component, such as a silicone resin, phosphor particles 23b, and light scatterers 23c, but contains no inorganic pigment particles 23a. Therefore, the inorganic pigment particles 23a are contained only in the first resin layer 23d.

While the second resin layer 23e in FIG. 6 contains the phosphor particles 23b and the light scatterers 23c, neither of them or only one of them may be contained in the second resin layer 23e.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims. This application is based upon and claims the benefit of priority from the prior Japanese Patent Application No. 2017-169204 filed on Sep. 4, 2017, the entire contents of which are incorporated herein by reference.

What is claimed is:

1. A semiconductor light-emitting device comprising:
   a substrate;
   a light-emitting element mounted on said substrate; and
   a seal layer provided on said substrate so as to seal said light-emitting element, wherein
   said seal layer contains a resin layer containing inorganic pigment particles dispersed therein, and
   an average particle size of said inorganic pigment particles has from 1 μm to 50 μm or smaller in a volumetric basis particle size distribution which is measured by a laser diffraction scattering particle size distribution measurement method,
   said inorganic pigment particles dispersed at a concentration becoming thicker in a direction toward said substrate.

2. The semiconductor light-emitting device according to claim 1, wherein said seal layer further contains at least one of a phosphor and/or a light scatterer.

3. The semiconductor light-emitting device according to claim 1, wherein
   said seal layer includes a first seal layer provided to be in contact with said light-emitting element, and a second seal layer provided so as to cover said first seal layer, and
   only said first seal layer contains said inorganic pigment particles.

4. The semiconductor light-emitting device according to claim 3, wherein
   said seal layer includes at least one of the phosphor and the light scatterer, and said at least one of the phosphor and the light scatterer is contained only in said second seal layer.

5. The semiconductor light-emitting device according to claim 1, wherein each of said inorganic pigment particles have a specific gravity higher than that of the resin constituting said seal layer.

6. The semiconductor light-emitting device according to claim 1, wherein said inorganic pigment particles contain titanium as a main component.

7. The semiconductor light-emitting device according to claim 1, comprising a tubular body configured to form a wall surrounding said light-emitting element.

8. The semiconductor light-emitting device according to claim 1, wherein said inorganic pigment particles absorb a part of a light outputted from the light-emitting element.

9. A method for producing the semiconductor light-emitting device defined by claim 1 comprising the steps of:
   placing a light-emitting element on a substrate;
   performing potting so as to cover said light-emitting element with a resin raw material containing at least inorganic pigment particles as a component;
   settling out said inorganic pigment particles toward said substrate; and
   curing said resin raw material.

* * * * *